United States Patent [19]

Benitez, III et al.

[11] Patent Number: 4,517,455

[45] Date of Patent: May 14, 1985

[54] DUAL PEAK DETECTOR

[75] Inventors: Willie B. Benitez, III, Lubbock; Billy R. Masten, Shallowater, both of Tex.

[73] Assignee: Texas Instruments Incorporated, Dallas, Tex.

[21] Appl. No.: 432,626

[22] Filed: Oct. 4, 1982

[51] Int. Cl.³ .............................................. G06K 7/10
[52] U.S. Cl. .................................... 235/463; 235/482; 235/472
[58] Field of Search ...................... 235/462, 463, 472

[56] References Cited

U.S. PATENT DOCUMENTS 4,335,301 6/1982 Palmer ............................... 235/462

Primary Examiner—Harold I. Pitts

Attorney, Agent, or Firm—Richard A. Bachand; N. Rhys Merrett; Melvin Sharp

[57] ABSTRACT

A dual peak detector circuit containing a first circuit for receiving the input voltage and storing the maximum value of the input voltage and a second circuit for receiving the input voltage and storing the minimum value of the input voltage. Both are connected to third circuit which also receives the input voltage and provides an output when the input voltage transitions from the maximum input value to the minimum input value. When the input voltage transitions from the minimum input value to the maximum output value, the third circuit alters the output to indicate the input voltage change.

9 Claims, 4 Drawing Figures

DUAL PEAK DETECTOR

BACKGROUND OF THE INVENTION

1. Field of the Invention

This invention relates to dual peak detecting circuitry and specifically to optical bar code reading devices using dual peak detection circuitry.

2. Description of the Prior Art

The problem area of the present invention is the use of light pens in reading optical bar code. This problem has been solved in the past by using circuits that interface to the light pens. Light pens traditionally provide a signal representing whether the light pen is passing across a white reflecting surface or a black absorbing surface. Therefore, these interfacing circuits determine when the output is high from the light pen, indicating a white surface or is low from the light pen, indicating a black surface. One such interface circuit is illustrated in the article, "Signal Processing for Optical Bar Code Scanning" by Frederick L. Merkowitz published in Byte, Vol. 1:16, published December 1976, pp. 77–84. Specifically the circuit shown in FIG. 3 provides an output for the bar code reading light pen. Information received by circuitry connected to the light pen is converted into digital information which is used by digital processors elsewhere. Information stored by bar codes traditionally has been price and inventory information.

Light pen interface circuits in the prior art have the capability to digitize the output, i.e., these circuits provide one output state when the light pen is reading a white bar and the other output state when the light pen is reading a black bar. These circuits are called dual peak detector circuits because they detect the high and low peaks of the voltage from the light pens. A dual peak detection circuitry is disclosed in the article entitled, "Two ICs Measure Waveform Levels" by Steven L. Ross, published in EDN, Feb. 17, 1982. This circuit provides the voltage maximum of an input voltage waveform together with the voltage minimum and Vtot which represents the difference between voltage maximum and voltage minimum.

The disadvantage of the circuits in the prior art is that they do not detect with certainty the first transition between a white surface and a black surface. It is the object invention to provide a bar code reading circuit and a dual peak detector circuit that detect with certainty the first transition between the white and dark bar codes.

SUMMARY

In accordance with the present invention, a dual peak detector is provided that includes a first circuit for receiving an input voltage and storing the maximum value of the input voltage, a second circuit for receiving the input voltage and storing the minimum value of the input voltage and a third circuit connected to the input voltage and to the first and second circuits for providing an output indicating when the input voltage transitions from the maximum value to its minimum value and from the minimum value to its maximum value.

In a preferred embodiment of the invention, a dual peak detector circuit is provided that includes a first circuit including an operational amplifier connected to a diode and capacitor. This first circuit permits the storage of the maximum value of the input voltage by allowing the maximum voltge to be input through the diode to the capacitor. When the input voltage decreases from its maximum value, the diode blocks the discharge of the capacitor. A second voltage means is also connected to the input voltage to store the minimum value of the input voltage. The second circuit also includes an operational amplifier, a diode and a capacitor. However, the diode is reversed relative to the operational amplifier in comparison with the first circuit. This allows the capacitor to store the input voltage to the maximum value and then permits the discharge of the capacitor voltage when the input voltage decreases to its minimum value. After this discharge the capacitor retains the minimum charge. A third circuit connected to the input voltage and to the first circuit and second circuit includes a capacitor that stores the difference voltage between the input voltage maximum and the input voltage minimum. This capacitor is connected also to two buffer operational amplifiers which are in turn connected to a voltage divider. The voltage divider provides a selected portion of the difference voltage to a comparator circuit. This comparator circuit is also connected to the input voltage and provides an output when the input voltage transitions from its maximum value stored in the first circuit to its minimum value stored in the second circuit by detecting when the input voltage in less than the sum of the minimum value and the selected portion of difference voltage stored in the third circuit.

A bar code optical reader circuit is provided that consist of a light-emitting diode to radiate light upon a surface and a photosensitive transistor to receive the light reflected from the surface by the light-emitting diode. The photosensitive transistor output is input into an operational amplifier which provides the input voltage for the dual peak detector circuit. In a preferred embodiment of this invention, the light-emitting diode and the photosensitive transistor are part of a light pen that is used to optically read a bar code.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DESCRIPTION OF THE PREFERRED EMBODIMENT

Figure 1:
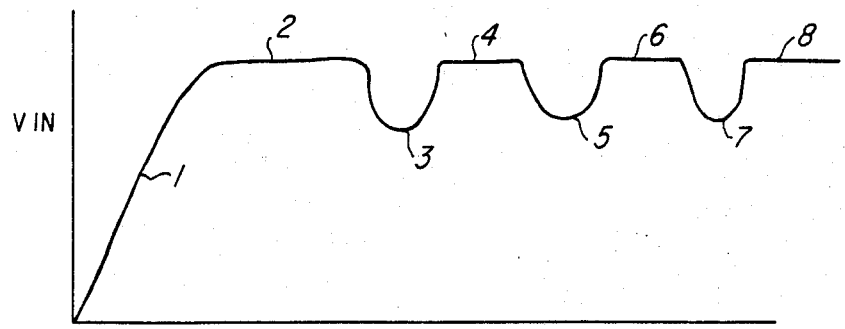
FIG. 1 is a graph of voltage versus time representing the output of a light pen reading a typical bar code.

The objective of the present invention is to provide a reliable output for an optical bar code reading light pen type device. Light pens are quite common in today's consumer market and are used for reading bar codes of black stripes on white backgrounds. These bar codes when read and interpreted properly, provide digital data for use in digital processing circuitry. This information typically includes the price and inventory codes of specific products. The light pen for the present invention includes both a light-emitting diode and a photosensitive transistor. The light-emitting diode provides the light on the surface and the photosensitive transistor detects the light reflected by the surface. In a typical bar code reading application, the light reflected from a white surface will provide a greater input to the photosensitive transistor than will the black stripes on the bar code. FIG. 1 represents the typical output from the light pen of the present invention. The Voltage Rise 1 represents the "turning on" of the device and the placing of the light pen on the surface. The voltage increases because as the light approaches the surface, the reflected light received by the photosenstive transistor will increase. When the light pen is positioned on the bar code on a white surface, the output voltage from the light pen will be a maximum as shown by 2. As the light pen is moved across the first black bar, the amount of light received by the photosensitive transistor will decrease since the black bar absorbs the light emitted by the light-emitting diodes in the light pen. Therefore, the voltage will dip as shown 3. After the light pen passes over this black bar, it will return to a white surface and produce a voltage 4. When the light pen again encounters a black surface, the voltage output of the light pen will again dip as shown as 5. Areas 6, 7 and 8 then represent a white to black to white reading by the light pen.

Figure 2:
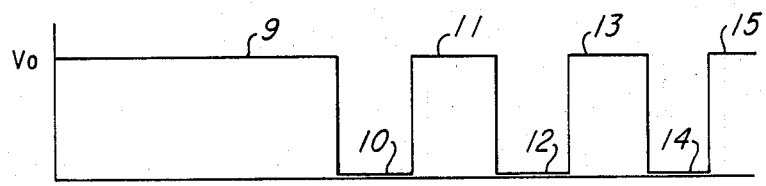
FIG. 2 is a graph of voltage versus time representing the ideal output from a circuit interfaced to a light pen reading the bar code as illustrated in FIG. 1.

FIG. 2 illustrates the ideal output from a circuit connected to the light pen. Area 9 represents the area as the light pen is being brought to the paper and provides a high output. Areas 11, 12 and 15 are like areas 9 and indicate the light pen is reading a white surface. Likewise, areas 10, 12 and 14 correspond to the voltage dips 3, 5 and 7 in FIG. 1, indicating that the light pen is passing over a black bar code.

Figure 3:
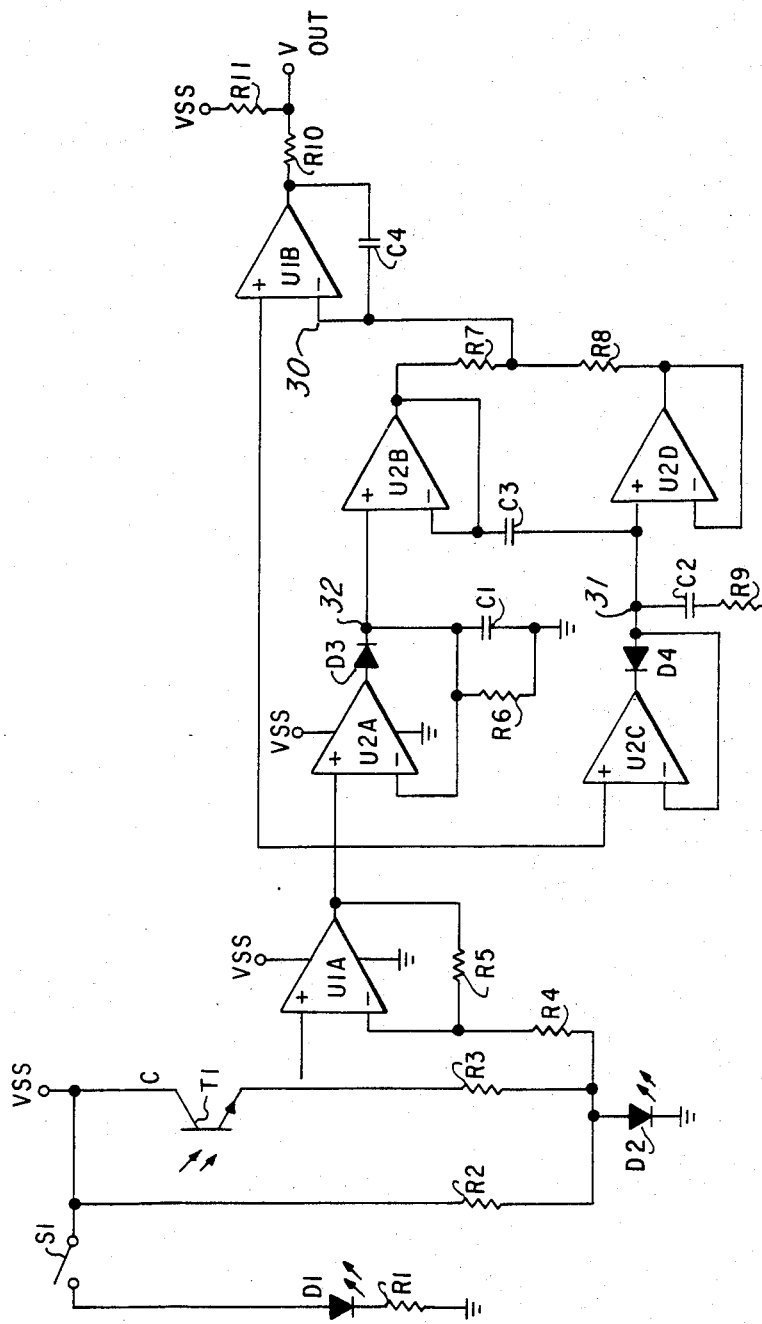
FIG. 3 is a schematic diagram illustrating optical reading circuitry together with a dual peak detector circuit.

FIG. 3 is a schematic of the present invention which includes a light pen and dual peak detector. When switch S1 is closed, the diode D1 emits light together with diode D2 to the photosensitive transistor T1. The resistor R1 is provided in series with the diode D1 to limit the amount of current flowing through diode D1. Resistors R2 and R3 regulate the photosensitive transistor T1. An operational amplifier U1A is connected to the emitter of the photosensitive transistor T1. This operational amplifier U1A is provided for current amplification and as a buffer stage to prevent the loading of the photosensitive transistor T1. Resistor R5 may be connected to influence the response time of this circuit. However, in a typical light pen bar code reading application, the response time is not critical because of the slowness in which a light pen is brought across a bar code. Typically resistors R1, R2 and R3 are of the same value. The output of the operational amplifier U1A provides an input voltage to the peak detector circuit. The circuit combination of the operational amplifier U2A, the diode D3, the capacitor C1 in parallel with resistor R6 is the circuit that stores the maximum value of the input voltage from the light pen. As the voltage increases, the operational amplifier U2A charges capacitor C1. However, when the input voltage decreases from its maximum value, diode D3 blocks the discharge of the capacitor C1 and the capacitor C1 connected to the negative input of the operational amplifier U2A causes this operational amplifier to reach a steady state.

The second circuit consisting of operational amplifier U2C, diode D4, capacitor C2, capacitor C3 and resistor R9 provide storage for the minimum input voltage value. When the maximum input voltage is input, capacitor C3 stores this voltage through operational amplifier U2C and operational amplifier U2B. However, when the input voltage decreases from its maximum value to its minimum value, diode D4 permits the discharge of capacitor C2 and charge of C3 to allow the voltage across C2 to only represent the minimum value of the input voltage.

The third circuit of this invention includes the capacitor C3 connected between the two operational amplifiers U2B and U2D which are in turn connected to a voltage divider circuit including two resistors R8 and R7. The output of the voltage divider circuit is connected to the input of comparator U1B. The other input of the comparator U1B is connected to the input voltage. Operational amplifiers U2B and U2D act as a buffer between capacitor C3 and the voltage divider R7 and R8. The voltage stored in capacitor C3 is the difference voltage defined as the difference between the maximum input voltage, as defined in C1, and the minimum input voltage, as defined in C2. The voltage divider R7 and R8 then selects a portion of this voltage across C3 and provides this voltage as an input to comparitor U1B. U1B then provides an output when the input voltage is greater than the sum of the selected portion of the voltage difference and the minimum input voltage. The output voltage of this circuit can be inverted to provide an output when the black bars are read or an output when the white portions of the bar code are read. Typical values of the voltage divider R7 and R8 are 5.6K Ohms for R7 and 3.9K Ohms for R8. This provides the portion of the voltage input difference across R3 to be less than 50%. The operational amplifier U2D would not normally be required if the input signals to the circuit were of a faster nature than is normally typical of light pen bar code reading circuits. However, operational amplifier U2B would still be required to prevent the capacitor C3 from being discharged through the voltage divider R7 and R8 and to prevent capacitor C1 from being discharged by the decreasing output of operational amplifier U2C.

Figure 4:
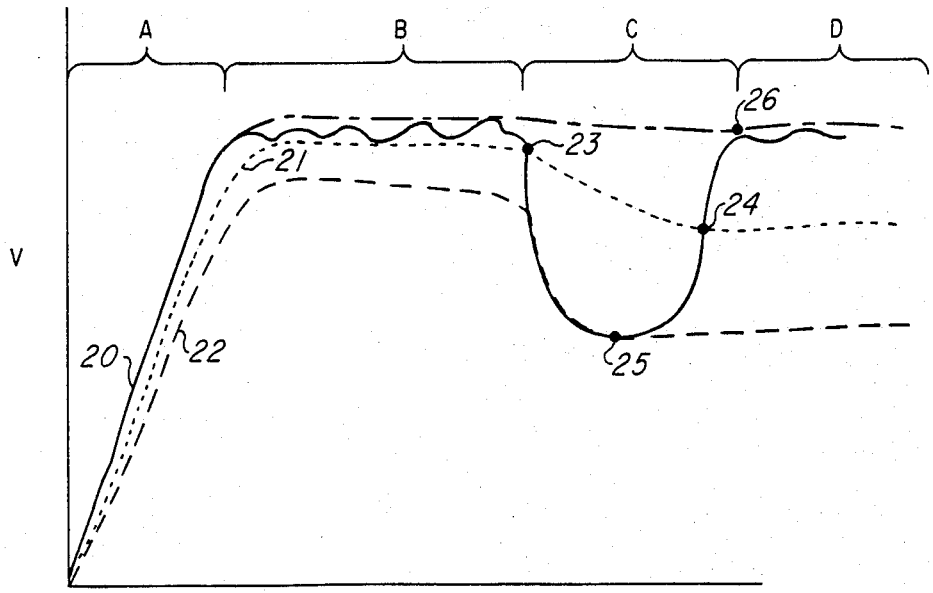
FIG. 4 is a graph of voltage versus time representing the typical input to the circuit of this invention and the resulting output.

FIG. 4 illustrates the operation of the circuit in FIG. 3 for a typical application as illustrated in FIG. 1. FIG. 4 is divided into four portions: A, B, C and D, representing difference phases of the bar code reading sequence. In portion A, as in 1 in FIG. 1, the light pen is being brought to the surface of the bar code. Line 20 represents the actual input voltage from operational amplifier U1A. Line 22 represents the minimum input voltage value at circuit point 31. This minimum value lags the actual input voltage value because of the capacitors C3 and C2. Dotted line 21 represents the output of the voltage divider at circuit point 30. Since the comparator U1B receives the output of the voltage divider and the input voltage itself as long as the input voltage exceeds the voltage shown as line 21, a circuit output will remain high. Therefore the output of the circuit is high at the conclusion of period A.

During period B, the input voltage on line 20 waivers to represent the different shades of white contained on the bar code. Note that the resistors selected for the voltage divider have been chosen such that the voltage 21 will be below any variance in the input voltage caused by different shades of white as the light pen passes across the bar code. The input voltage maximum which occurred at the beginning portion of period B is stored by capacitor C1 and causes the line 26 representing the maximum stored value in circuit point 32 to remain high. At the end of period B, the input voltage is still higher than the voltage at point 30 in the dual peak detector circuit and the output voltage of the circuit remains high.

During period C, the input voltage drops to a minimum value 25, representing the passage of the light pen across a black bar code. Since the minimum value of the input voltage stored in C2 and the selected portion of the voltage C3 are at the beginning of period C still less than the input voltage, the output of the circuit remains high at the beginning of period 3, but transitions to a low value as the input voltage passes below the value of the voltage in circuit point 30 as illustrated by point 23 in FIG. 4. During the decrease of the input voltage to point 25, the voltage at circuit point 31 drops as illustrated by line 22. This is permitted by the discharge of capacitor C2 and the charge of capacitor C3 through diode D4 as previously discussed. At this time, the voltage output from the voltage divider at circuit point 30 decreases from point 23 to point 24 as illustrated in FIG. 4. If the bar code reader continues to read black bars as illustrated in FIG. 1, the circuit point 30 should remain at a voltage approximately at point 24 for the remainder of the reading of the bar code.

Returning to FIG. 3, the capacitor C4 is placed across the output of the comparitor U1B to reduce the noise. However, as discussed earlier the noise caused by the light pen reading various shades of white across the bar code as illustrated in period B in FIG. 4, cannot be overcome by C4; rather, this condition must be avoided by the proper selection of the resistors in the voltage divider circuit R7 and R8. By selecting these resistor values such that the portion of the voltage difference selected is less than 50% an erroneous voltage transition caused the passing of the light pen over various shades of white will be avoided.

What we claim is:

1. A dual peak detector circuit comprising:
   a first circuit means for receiving an input voltage and storing the maximum value of said input voltage;
   a second circuit means for receiving said input voltage and storing the minimum value of said input voltage; and
   a third circuit means connected to said first and said second circuit means, said third circuit means for providing an output when said input voltage transitions from said maximum value to said minimum value by storing a selected portion of the voltage difference between said maximum voltage and said minimum voltage and providing said output when said input voltage is less than the sum of the selected portion and the minimum voltage.

2. A dual peak detector according to claim 1 wherein first circuit means includes a capacitor connected to a diode, said diode connected to permit the charging of said capacitor and prevent the discharging of said capacitor when said input voltage decreases from the voltage stored in said capacitor.

3. A dual peak detector circuit according to claim 2, wherein said first circuit means includes an operational amplifier that is connected to said input voltage, said diode and said capacitor for charging said capacitor to said maximum input voltage value.

4. A dual peak detector circuit according to claim 3, wherein second circuit means includes a second diode and second capacitor connected to allow the second capacitor to charge to the minimum input voltage value and to discharge any voltage above the minimum value through the second diode.

5. A dual peak detector circuit according to claim 4, wherein second circuit means includes an operational amplifier connected to said second diode.

6. A dual peak detector according to claim 5, wherein said third circuit means includes a third capacitor and a resistor voltage divider connected such that said third capacitor stores the difference between said maximum input voltage and said minimum input voltage and said voltage divider outputs a selected portion of said difference voltage to a comparator which provides said output from said third circuit means.

7. A dual peak detector according to claim 6, wherein third circuit means further includes a first and second buffer connected on either side on said third capacitor to buffer the third capacitor from said voltage divider.

8. A dual peak detector according to claim 7, wherein said third circuit means further includes a fourth capacitor that is connected between the output of the comparator and one of the inputs to the comparator to reduce noise.

9. A bar code optical reader circuit comprising: an optical bar code sensing circuit including a light-emitting diode means for emitting light and a photosensitive transistor means for receiving light from said light-emitting diode means that has been reflected from a surface and providing a voltage input;
   a first circuit means for receiving said voltage input and storing the maximum value of said voltage input;
   a second circuit means for receiving said voltage input and for storing the minimum value of said voltage input; and
   a third circuit means connected to said voltage input and said first and said second circuit means, said third circuit means for providing an output when said input voltage transitions from said maximum value to said minimum value by storing a selected portion of voltage difference between the maximum input voltage and the minimum input voltage and providing said output when said input voltage is less than the sum of the selected portion of the voltage difference and said minimum input voltage.

* * * * *